US006951705B2

(12) United States Patent
Fryd et al.

(10) Patent No.: US 6,951,705 B2
(45) Date of Patent: Oct. 4, 2005

(54) POLYMERS FOR PHOTORESIST COMPOSITIONS FOR MICROLITHOGRAPHY

(75) Inventors: Michael Fryd, Philadelphia, PA (US); Periyasamy Mookkan, Wilmington, DE (US); Frank Leonard Schadt, III, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 80 days.

(21) Appl. No.: 10/257,900

(22) PCT Filed: May 4, 2001

(86) PCT No.: PCT/US01/14520

§ 371 (c)(1), (2), (4) Date: Oct. 16, 2002

(87) PCT Pub. No.: WO01/86352

PCT Pub. Date: Nov. 15, 2001

(65) Prior Publication Data

US 2003/0211417 A1 Nov. 13, 2003

Related U.S. Application Data

(63) Continuation-in-part of application No. 09/714,782, filed on Nov. 16, 2000
(60) Provisional application No. 60/166,035, filed on Nov. 17, 2000, and provisional application No. 60/201,961, filed on May 5, 2000.

(51) Int. Cl.$^7$ ............................................. G03F 7/004
(52) U.S. Cl. .................... 430/270.1; 430/905; 430/907; 430/910
(58) Field of Search ............................. 430/270.1, 905, 430/907, 910, 909

(56) References Cited

U.S. PATENT DOCUMENTS

| | | | |
|---|---|---|---|
| 3,414,549 A | 12/1968 | Schaefgen | |
| 3,444,148 A | 5/1969 | Adelman | |
| 4,421,843 A | 12/1983 | Hattori et al. | |
| 5,177,166 A | 1/1993 | Kobo et al. | |
| 5,229,473 A | 7/1993 | Kobo et al. | |
| 5,260,161 A | * 11/1993 | Matsumura et al. | 430/161 |
| 5,459,010 A | * 10/1995 | Shimizu et al. | 430/175 |
| 6,030,747 A | 2/2000 | Nakano et al. | |
| 6,242,153 B1 | 6/2001 | Sato et al. | |
| 6,277,541 B1 | * 8/2001 | Uno et al. | 430/278.1 |
| 6,423,467 B1 | * 7/2002 | Kawauchi et al. | 430/270.1 |
| 6,503,686 B1 | * 1/2003 | Fryd et al. | 430/270.1 |
| 6,517,990 B1 | * 2/2003 | Choi et al. | 430/270.1 |
| 6,576,392 B1 | * 6/2003 | Sato et al. | 430/270.1 |

FOREIGN PATENT DOCUMENTS

| | | |
|---|---|---|
| DE | 4207261 | 9/1993 |
| DE | 4207264 | 9/1993 |
| DE | 4319178 | 9/1993 |
| EP | 0789278 A2 | 8/1997 |
| JP | 123263 | 12/1986 |
| JP | 62240953 | 10/1987 |
| JP | 6161109 | 6/1994 |
| JP | 8174107 | 6/1996 |
| SU | 2487894/28-12 | 2/1979 |
| WO | WO0017712 | 3/2000 |
| WO | WO0025178 | 5/2000 |
| WO | WO0137047 | 5/2001 |

OTHER PUBLICATIONS

Introduction to Microlithography, Second Edition by L.F. Thompson, C. G. Willson and M. J. Bowden, American Chemical Society, Washington, DC 1994, Chapter 3 "Organic Resist Materials".

Synthesis and Evaluation of Alicyclic Backbone Polymers for 193 nm Lithography, Ito et al, American Chemical Society, (1998), Chapter 16, pp. 208–222.

Advances in Resist Technology and Processing IX, Anthony E. Novembre, The International Society for Optical Engineering Mar. 1992, vol. 1672, pp. 500–512.

Synthesis and Preliminary Evaluation of Substituted Poly (Norbornene Sulfones) for 193 NM Lithography, Ito et al, 1997 American Chemical Society, vol. 77, p. 449–450.

Dry Etch Resistance of Organic Materials, Gokan et al., J. Electrochem, Soc., Jan. 1983, pp 143–146.

Cyclization Reaction in Acrylonitrile–Contained Acrylic Copolymers and Its Possible Application for the Improvement of Dry Etch Resistance for Photoresists, Zhao et al., J. Photopolym. Sci. Technol., vol. 11, No. 3, 1998, pp 525–532.

Organic Materials Challenges for 193 nm Imaging, Acc. Chem. Res. 1999, 32, p. 659–667, Reichmanis et al.

Synthesis of Cycloolefin–Maleic Anhydride Alternating Copolymers for 193 nm Imaging, Houlihan et al., Macromolecules, vol. 30, No. 21, 1997.

Poly(alpha–methyl–p–hydroxystrene–co–methacrylonitrile) Based Single–Layer Resists for VUV Lithography: (1) Synthesis, Properties and Photochemistry, Shirai et al., J. Photopolymer Science and Technology, vol. 13, No. 3 (2000), pp. 456–466.

Photochemical Reaction or Polymers Used as Resists by 146–nm Light Exposure, Kishimura et al., J. of Photopolymer Science and Technology, vol. 12, No. 5 (1999), pp. 717–720.

* cited by examiner

Primary Examiner—John S. Chu

(57) ABSTRACT

Nitrile/vinyl ether-containing polymers for photoresist compositions and microlithography methods employing the photoresist compositions are described. These photoresist compositions comprise 1) at least one ethylenically unsaturated compound comprised of a vinyl ether and 2) a nitrile-containing compound, e.g., acrylonitrile, which together impart high ultraviolet (UV) transparency and developability in basic media. In some embodiments, these photoresist compositions further comprise a fluoroalcohol group. The photoresist compositions of this invention have, high UV transparency, particularly at short wavelengths, e.g., 157 nm and 193 nm, which property makes them useful for lithography at these short wavelengths.

7 Claims, No Drawings

POLYMERS FOR PHOTORESIST COMPOSITIONS FOR MICROLITHOGRAPHY

CROSS REFERENCE TO RELATED APPLICATIONS

This application claims the benefit of prior filed copending provisional application No. 60/201,961 filed on May 5, 2000; this application is a continuation in part of Ser. No. 09/714,782 filed on Nov. 16, 2000 which claims the benefit of prior filed provisional application No. 60/166035 filed on Nov. 17, 2000 which are all incorporated by reference herein in their entireties.

BACKGROUND OF THE INVENTION

1. Field of the Invention

The present invention pertains to photoimaging and, in particular, the use of photoresist compositions (positive-working and/or negative-working) for imaging in the production of semiconductor devices. The present invention also pertains to photoresist compositions containing polymer compositions having high UV transparency (particularly at short wavelengths, e.g., 157 nm or 193 nm) which are useful as the film forming resin in a resist composition.

2. Background

In the process for manufacturing semiconductor devices, very fine features are etched onto a substrate, typically a silicon wafer. The features are formed on the substrate by electromagnetic radiation which is impinged, imagewise, on a photoresist composition applied to the silicon waver. Areas of the photoresist composition which are exposed to the electromagnetic radiation change chemically and/or physically to form a latent image which can be processed into an image for semiconductor device fabrication. Positive working photoresist compositions generally are utilized for semiconductor device manufacture.

The photoresist composition is applied to the silicon wafer by spin coating. The silicon wafer may have various different material layers applied to it in other processing steps. In addition, in a particular photolithographic processing step, the silicon wafer may have a hard mask layer, typically of silicon dioxide or silicon nitride, applied below the photoresist composition layer. In addition, an antireflective layer (ARC) may be applied below the photoresist composition layer, by a coating process (and is then typically referred to as a bottom anti-reflective (BARC)) or on top of the photoresist composition layer (and typically called a top anti reflective layer (TARC)). Typically the thickness of the resist layer is sufficient to resist the dry chemical etch processes used in transferring a pattern to the silicon wafer.

Various polymer products for photoresist compositions have been described in *Introduction to Microlithography, Second Edition* by L. F. Thompson, C. G. Willson, and M. J. Bowden, American Chemical Society, Washington, D.C., 1994.

The photoresist composition generally comprises a film forming polymer which may be photoactive and a photosensitive composition that contains one or more photoactive components. As described in the Thompson et al. publication, upon exposure to electromagnetic radiation (e.g., UV light), the photoactive component acts to change the Theological state, solubility, surface characteristics, refractive index, color, electromagnetic characteristics or other such physical or chemical characteristics of the photoresist composition.

The use of ultraviolet light of lower wavelength corresponds to higher resolution (lower resolution limit). Lithography in the UV at 365 nm (I-line) is a currently established image-forming process for making semiconductor devices. The features formed by this process have a resolution limit of about 0.35–0.30 micron. Known photoresist compositions for lithography using a 365 nm wavelength are made from novolak polymers and diazonaphthoquinones as dissolution inhibitors. Lithography in the deep UV at 248 nm has been found to have a resolution limit of approximately 0.35–0.13 micron. The known photoresist compositions for this process are made from p-hydroxystyrene polymers. Lithographic processes using electromagnetic radiation at even shorter wavelengths are looked to for forming very fine features because the use of lower wavelengths correspond to higher resolution; that is, in deep (wavelength less than 300 nm), vacuum (wavelength less than 200 nm) or even the extreme (wavelength less than 30 nm) ultraviolet. However, at wavelengths of 193 nm or shorter, the photoresist compositions known for use at 365 nm and 248 nm have been found to lack sufficient transparency.

A key difficulty encountered in developing polymers for use in photoresist compositions that are imaged at lower wavelengths, e.g., 157 nm, is the lack of transparency at these low wavelengths. The transparency requirements for photoresist compositions are usually on the order of allowing less than about 20 to about 40% of incident light to penetrate the fill thickness of the resist layer to produce an image with well-defined, vertical, side walls which are important in achieving high resolution and minimizing defects. Polymers which lack transparency absorb too much light and thereby produce an unacceptable image with low resolution and too many defects.

Because photolithography at the shorter wavelengths would provide the very fine features having lower resolution limits; that is, a resolution limit of approximately 0.18–0.12 micron at 193 nm, approximately 0.07 micron at 157 nm photoresist compositions that will be sufficiently transparent at these short wavelenths are needed.

There is a need for suitable photoresist compositions for use at 193 nm and lower, particularly at 157 nm, that have not only high transparency at these short wavelengths but also other key properties including good plasma etch resistance, good developability, and good adhesive properties.

SUMMARY OF THE INVENTION (a) In one embodiment, the invention relates to a photoresist composition comprising:

(a) a polymer comprising:
(i) a first repeat unit derived from at least one ethylenically unsaturated compound comprising a vinyl ether and having the structure:

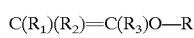

where $R_1$, $R_2$, and $R_3$ independently are a hydrogen atom or an alkyl group ranging from 1 to about 3 carbon atoms;

R is a substituted or unsubstituted hydrocarbon group containing from 1 to about 20 carbon atoms, when R is a substituted hydrocarbon group it, typically, contains at least one of a fluorine, chlorine, bromine or oxygen atom;

(ii) a second repeat unit derived from at least one ethylenically unsaturated compound having the structure:

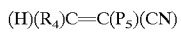
(H)(R$_4$)C=C(P$_5$)(CN)

wherein R$_4$ is a hydrogen atom or a cyano group; R$_5$ is a hydrogen atom, an allyl group ranging from 1 to about 8 carbon atoms, or a CO$_2$R$_6$ group, wherein R$_6$ is a hydrogen atom or an alkyl group ranging from 1 to about 8 carbon atoms; and (iii) an acidic group or a protected acidic group; and at least one photoactive component.

In another embodiment, the invention relates to a process for forming a photoimageable substrate comprising, the steps of:

(A) forming a layer comprising a photoresist composition on a substrate, wherein the photoresist composition comprises:
 (a) a polymer comprising:
  (i) a repeat unit derived from at least one ethylenically unsaturated compound comprising a vinyl ether and having the structure:

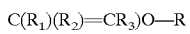
C(R$_1$)(R$_2$)=CR$_3$O—R where R$_1$, R$_2$, and R$_3$ independently are a hydrogen atom or an alkyl group ranging from 1 to about 3 carbon atoms;
R is a substituted or unsubstituted hydrocarbon group containing from 1 to about 20 carbon atoms, when R is a substituted hydrocarbon group it, typically, contains at least one of a fluorine, chlorine, bromine or oxygen atom;
  (ii) a repeat unit derived from at least one ethylenically unsaturated compound having the structure:

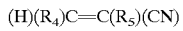
(H)(R$_4$)C=C(R$_5$)(CN)

where R$_4$ is a hydrogen atom or cyano group; R$_5$ is a hydrogen atom, an alkyl group ranging from 1 to about 8 carbon atoms, or a CO$_2$R$_6$ group, wherein R$_6$ is a hydrogen atomr or an allyl group ranging from 1 to about 8 carbon atoms; and
  (iii) an acidic group or a protected acidic group;
 (b) at least one photoactive component; and
 (c) a solvent; and
(B) drying the photoresist composition to substantially remove the solvent and thereby form a layer comprising the photoresist composition on the substrate.

With respect to some specific embodiments of the photoresist compositions and associated processes of this invention, the polymer containing the first repeat unit and the second repeat unit is a component in a photoresist composition which can have a light absorbance per micron (of film thickness) of less than 5.0 $\mu m^{-1}$ at a wavelength of 157 nm.

We have found that a polymer of a nitrile containing compound and a fluoroalcohol furnished an effective polymer for use in photoresist compositions. We have found that a vinyl ether moiety included in such a polymer increases polymer yield.

DETAILED DESCRIPTION OF THE INVENTION

A characteristic of the polymer (and photoresist compositions comprised of the polymer) of this invention is the cooperative combination of the first repeat unit, the second repeat unit and the acidic group.

Another characteristic of the polymer is that it does not detrimentally absorb in the vacuum UV and far UV wavelengths of the electromagentic spectrum.

The First Repeat Unit

The photoresist compositions of this invention in one embodiment comprise a polymer which contains a first repeat unit derived from at least one ethylenically unsaturated compound comprising a vinyl ether and having the structure:

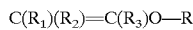
C(R$_1$)(R$_2$)=C(R$_3$)O—R where R$_1$, R$_2$, and R$_3$ independently are a hydrogen atom or an alkyl group ranging from 1 to about 3 carbon atoms, preferably, R$_1$, R$_2$, and R$_3$ are hydrogen atoms. high yields have been achieved when R$_1$, R$_2$, and R$_3$ are hydrogen. R is a hydrocarbon group containing from 1 to about 20 carbon atoms which may contain one or more heteroatom substituents. Typically, R is an allyl, aryl, aralkyl, or alkaryl group of from 1 to about 20 carbon atoms optionally containing one or more heteroatonic groups. R can be a straight chain or a branched chain. The heteroatom can be fluorine, chlorine, bromine, or oxygen. When the heteroatom substituent of R is oxygen, R typically contains a hydroxyl, C$_1$ to C$_6$ alkoxy, carboxyl, or carboxyl ester group. Fluorine is a preferred heteroatom.

The first repeat unit can be derived from 2-hydroxyethylvinyl ether; methylvinylether; ethylvinylether; propylvinylether; 2-ethylhexylvinylether; isopropylvinylether; CH$_2$=CO(CH$_2$)$_2$(CF$_3$)$_m$CF$_3$, where m ranges from 0–12; phenylvinylether; benzylvinylether; p-tolylvinyl ether; or 1-adamantylvinyl ether.

The Second Repeat Unit

The presence of a second repeat unit containing a cyano (CN) group in these polymers has been found to result in high optical transparency (i.e., to have low optical absorptions in the vacuum and far UV) and improved etch resistance. The second repeat unit can also provide polar functionality that facilitates developability at a lower level of acidic groups (such as fluoroalcohol, ester or aromatic phenol groups) than would otherwise, usually, be required. The minimization of functionality which absorb in the vacuum and far ultraviolet regions of the electromagnetic spectrum, such as aromatic groups, and carbonyl groups, in the repeat units of the polymers is desirable in order for these polymers to possess high optical transparencies at wavelengths within these regions.

The second repeat unit is derived from at least one ethylenically unsaturated compound having at least one nitrile group and having the structure:

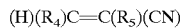
(H)(R$_4$)C=C(R$_5$)(CN)

wherein R$_4$ is a hydrogen atom or cyano group (CN); R$_5$ is an alkyl group ranging from 1 to about 8 carbon atoms, which can be a straight chain or a branched chain, CO$_2$R$_6$ group wherein R$_6$ is a hydrogen atom or an alkyl group ranging from 1 to about 8 carbon atoms, which can be a straight chain or a branched chain. This second repeat unit can be derived from acrylonitrile, methacrylonitrile, fumaronitrile (trans-1,2-dicyanoethylene), and maleonitrile (cis-1,2-dicyanoethylene). Acrylonitrile is preferred.

Acidic Group

One or more acidic groups that can be present in the first repeat unit or the second repeat unit or both or in one or more, optional, additional repeat units that can be present in the polymer have been found to impart sufficient acidity to the photoresist composition for developability in basic aqueous media. The acidic group may be any acidic group as long as it does not absorb light at low wavelengths, such as the vacuum and far UV regions. While the acidic group may be a carboxylic acid, care must be taken with certain carboxylic acids which, though useful for developability, may result in a photoresist composition that absorbs light in the vacuum and far UV regions which is undesirable in resists used at low imaging wavelengths (e.g., 157 nm or 193 nm).

One example of a suitable acidic group is a fluoroalcohol. Other examples include certain carboxylic acids such as acrylic acid or methacrylic acid.

When the acidic group is a fluoroalcohol it can have the structure:

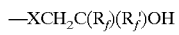

wherein $R_f$ and $R_f'$ are the same or different fluoroalkyl groups of from 1 to about 10 carbon atoms or taken together are $(CF_2)_n$ wherein n is an integer ranging from 2 to about 10; and X is an element from Group VB or Group VIB (Sargent Welch Periodic Table, 1979, Sargent Welch Scientific Company, Skokie, Ill.), typically, X is an oxygen atom, sulfur atom, nitrogen atom, or phosphorous atom. Oxygen is preferred.

The fluoroalkyl groups designated by $R_f$ and $R_f'$ can be partially fluorinated alkyl groups or fully fluorinated alkyl groups (i.e., perfluoroalkyl groups). When $R_f$ and $R_f'$ are partially fluorinated alkyl groups there must be a sufficient degree of fluorination present to impart acidity to the hydroxyl group (—OH) of the fluoroalcohol group, such that the hydroxyl proton is substantially removed in basic media, such as in aqueous sodium hydroxide solution or tetraalkylammonium hydroxide solution. This means that there will usually be sufficient fluorine substitution present in the fluorinated alkyl groups of the fluoroalcohol group for the hydroxyl group to have a $pK_a$ value of less than or equal to about 11, preferably, a pKa value between about 4 and about 11.

The groups designated by $R_f$ and $R_f'$ may be straight chain or branched chain or, taken together, are $(CF_2)_n$ wherein n is 2 to about 10. The terns "taken together" mean that $R_f$ and $R_f'$ are not separate, discrete fluorinated alkyl groups, instead together they form a ring structure such as is illustrated below in the case of a 5-membered ring:

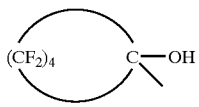

More preferably, $R_f$ and $R_f'$ are independently perfluoroalkyl groups of 1 to 5 carbon atoms, and, most preferably, $R_f$ and $R_f'$ are both trifluoromethyl ($CF_3$) groups.

When the acidic group is a fluoropolymer which forms a portion of the first repeat unit, it can have structural formula I:

$$C(R_1)(R_2)=C(R_3)-O-A-C(R_f)(R_f')OH$$

wherein $R_f$ and $R_f'$ and $R_1$, $R_2$, and $R_3$ are as defined above and A is at least one atom, or group of atoms, that links the vinyl ether through an oxygen atom to a carbon atom of the fluoroalcohol group. Typically A is an alkylene group containing from 1 to about 12 carbon atoms which can be a branched chain or a linear chain. A may contain a heteroatom such as oxygen, sulfur, fluorine or nitrogen which can be within the alkylene chain or pendant to the alkyl chain, for example, as a substituent group such as a perfluoro group. A could also be an alicyclic group containing from 3 to about 10 carbon atoms, for example cyclohexyl or norbornyl, or an aromatic group from 6 to about 14 carbon atoms, for example phenyl or naphthyl. A can also be a substituted alicyclic group in which case A contains a heteroatom such as oxygen, sulfur, fluorine or nitrogen which can be within the alicycle or pendant to the alicycle, for example as a substituent group such as a perfluoro group. A specific example of a perfluoro group is —$C(CF_3)_2$—. Some examples of the first repeat unit falling within structural formula I are described below:

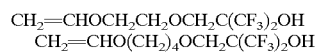

When the first repeat unit contains fluoroalcohol as the acidic group, the fluoroalcohol typically ranges from about 10 to about 60 mole percent and the second repeat unit typically ranges from about 20 to about 80 mole percent. More typically, the fluoroalcohol ranges from less than or equal to 45 mole percent, and, preferably, less than or equal to 30 mole percent with relatively small amounts of the nitrile group of the second repeat unit making-up the balance of the polymer. When the acidic group is a fluoroalcohol, it can be derived from 1,1-bis(trifluoromethyl)ethylene oxide; 1,1,1-trifluoro-4-methyl-2-(trifluoromethyl)-4-penten-1-ol.

The concentration of the acidic group, such as the fluoroalcohol group, can be determined by developability of the photoresist composition in aqueous basic solutions (e.g., standard 0.262 N TMAH solution). High concentrations of the acidic group can lead to a photoresist composition which will fail to function as a resist; that is, the photoresist composition will substantially dissolve away during the development step, failing to form a useful image. The concentration of the acidic group can vary with the structure of the moiety bearing the acidic group and with the selection of other monomer(s) and their concentrations as well as other parameters of the polymer such as molecular weight. Some specific illustrative examples of polymers, when the acidic group is a fluoroalcohol, which were found to have insufficient solubility in aqueous basic media were AN/IBFA (76/24) and AN/IBFA/NB (61/21/18) where AN is acrylonitrile, IBFA is 1,1-trifluoro-4-methyl-2-(trifluoromethyl)-4-penten-2-ol and NB is norbonene.

Protected Acidic Group

The acidic group may be protected. For the purposes of this invention, a "protected acidic group" means a group which, when deprotected, affords free acidic functionality that enhances the solubility, swellability, or dispersibility in aqueous environments.

The percentage of repeat units of the polymer containing protected acidic groups can range from about 1 to about 70 mole percent; preferably range from about 5 to about 55 mole percent; and more preferably range from about 10 to about 45 mole percent.

Nonlimiting examples of acidic groups of the protected acidic group are carboxylic acids and fluoroalcohols. At least one fluoroalcohol group of the polymer or other acidic group of the polymer (such as a carboxylic acid group) may be protected. An additive composition containing protected acidic groups may be incorporated into the photoresist composition. If such an additive is included, none, some or all of the acidic groups of the polymer may be protected. For example, the photoresist composition may comprise at least one member selected from the group consisting of a carboxylic acid, a fluoroalcohol, a protected fluoroalcohol, and a protected carboxylic acid.

When the polymer contains one or more protected acidic groups, the polymer will yield, by catalysis of acids or bases generated photolytically from photoactive compounds (PACs), a hydrophilic acidic group. A protected acidic group can be acid or base labile, such that when photoacid or photobase is produced upon imagewise exposure, the acid or base will catalyze deprotection and production of a hydrophilic acidic group. Deprotection can also be obtained by heating the photoresist composition.

An acidic group when deprotected affords free acidic functionality that enhances the solubility, swellability, dispersibility or a combination thereof in aqueous environments of the polymer to which the acidic group is bonded.

Examples of components having protected acidic groups that yield an acidic group upon exposure to photogenerated acid include A) esters capable of forming, or rearranging to, a tertiary cation, B) esters of lactone, C) acetal esters, D) β-cyclic ketone esters, E) α-cyclic ether esters, F) MEEMA (methoxy ethoxy ethyl methacrylate) and other esters which are easily hydrolyzable because of anchimeric assistance, G) carbonates formed from a fluorinated alcohol and a tertiary aliphatic alcohol. Some specific examples in category A) are t-butyl ester, 2-methyl-2-adamantyl ester, and isobornyl ester. Some specific examples in category B) are γ-butyrolactone-3-yl, γ-butyrolactone-2-yl, mavalonic lactone, 3-methyl-γ-butyrolactone-3-yl, 3-tetraliydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from addition of vinyl ethers, such as, for example, ethoxy ethyl vinyl ether, methoxy ethoxy ethyl vinyl ether, and acetoxy ethoxy ethyl vinyl ether.

Examples of protecting groups for fluorinated alcohols that yield the fluorinated alcohol as the hydrophilic group upon exposure to photogenerated acid or base include, but are not limited to, t-butoxycarbonyl (t-BOC), t-butyl ether, and 3-cyclohexenyl ether. Each of these protected acidic groups can be utilized in combination with the fluoroalcohol group of this invention to afford a protected acidic fluoroalcohol group. The fluoroalcohol group (protected or unprotected) of this invention can be used alone or it can be used in combination with one or more other acid groups, such as carboxylic acid group (unprotected) or a t-butyl ester of carboxylic acid (protected).

In this invention, often, but not always, the components having protected acid groups are repeat units having protected acid groups that have been incorporated in the polymer. Frequently the protected acid groups are present in one or more monomer(s) that are polymerized to form the polymer. Alternatively, the polymer can be formed by polymerization with an acid-containing monomer and then subsequently the acid can be partially or wholly converted by appropriate means to protected acidic groups. As one specific example, P(AN/VE-F-OH/tBA), in a polymeric reaction product of acrylonitrile, vinyloxyethyloxyhexafluoroalcohol adduct, and t-butyl acrylate, the t-butyl ester is the protected acidic group.

When the first repeat unit comprises the protected acid group the first repeat unit can be, for example, a reaction product of 1,1-bis(trifluoromethyl)ethylene oxide and either 2-hydroxyethylvinyl ether or 4-hydroxybutylvinyl ether, which can be subsequently reacted with a reagent to produce a protected acid group. An example of a reagent for producing the protected acid group (e.g., a protected fluoroalcohol) is chloromethylmethyl ether. Another example of a reagent for producing a protected acid group is di-t-butyl dicarbonate ($O(CO_2C(CH_3)_3)$); in this case, the protected acid group produced is t-butoxycarbonyl (t-BOC).

Other protected acids can also be introduced as noted above, for example, with alkyl substituted acrylates or alkyl substituted methacylates in which the alkyl group contains from 1 to about 10 carbon atoms and is straight or branched chain, such as tertiary butyl acrylate and tertiary butyl methacrylate, or with 4-tert-butoxycarbonyloxystyrene or 4-tert-butoxycarbonyloxy-alpha-methylstyrene. Typically, the alkyl group is a tertiary alkyl group.

In another embodiment, the polymer of this invention can include one or more aliphatic polycyclic groups. In this embodiment, the percentage of repeat units of the polymer containing aliphatic polycyclic groups can range from about 1 to about 70 mole percent; preferably from about 10 to about 55 mole percent; and more preferably from about 20 to about 45 mole percent.

The polymer of this invention can contain additional functional groups beyond those specifically mentioned herein provided that the polymer is substantially free of aromatic groups. Aromatic groups have been found to detract from transparency resulting in a photoresist composition which absorbs too strongly in the deep and extreme UV regions to be suitable for use in photoresist compositions that are imaged at these wavelengths.

In many embodiments according to this invention, the polymer has an optical absorbance per micron of less than $5.0\,\mu m^{-1}$ at a wavelength of 157 nm, preferably less than 4.0 $\mu m^{-1}$ at this wavelength, and, more preferably, less than 3.5 $\mu m^{-1}$ at this wavelength.

Branched Polymer

In some embodiments of this invention, the polymer is a branched polymer comprising one or more branch segment(s) chemically linked along a linear backbone segment. The branched polymer can be formed during free radical addition polymerization of at least one ethylenically unsaturated macromer component and at least one ethylenically unsaturated comonomer. The ethylenically unsaturated macromer component has a number average molecular weight ($M_n$) between a few hundred and about 40,000 and the linear backbone segment resulting from the polymerization has a number average molecular weight ($M_n$) between about 2,000 and about 500,000. The weight ratio of the linear backbone segment to the branch segment(s) is within a range of about 50/1 to about 1/10, and preferably within the range of about 80/20 to about 60/40. Preferably the macromer component has a number average molecular weight ($M_n$) from about 500 to about 40,000 and more preferably of about 1,000 to about 15,000. Typically such an ethylenically unsaturated macromer component can have a number average molecular weight ($M_n$) equivalent to there being from about 2 to about 500 monomer units used to form the macromer component, preferably between about 30 and about 200 monomer units, and most preferably about 10 to about 50 monomer units.

In a preferred embodiment, the branched polymer contains from about 25% to about 100% by weight of compatibilizing groups, i.e., groups which increase compatibility with the photoacid generator, preferably from about 50% to about 100% by weight, and more preferably from about 75% to about 100% by weight. Suitable compatibilizing groups for ionic photoacid generators include, but are not limited to, both non-hydrophilic polar groups and hydrophilic polar groups. Suitable non-hydrophilic polar groups include, but are not limited to, cyano (—CN) and nitro (—$NO_2$). Suitable hydrophilic polar groups include, but are not limited to protic groups such as hydroxy (OH), amino ($NH_2$), ammonium, amido, imido, urethane, ureido, or mercapto; or carboxylic ($CO_2H$), sulfonic, sulfinic, phosphoric, or phosphoric acids or salts thereof. Preferably, compatibilizing groups are present in the branch segment(s).

Preferably, the protected acidic groups, present in the branched polymer, produce fluoroalcohol groups or carboxylic acid groups or both after exposure to UV or other actinic radiation and subsequent post-exposure baking (i.e., during deprotection).

In the case of branched systems which contain a protected acidic group, the protected acidic group can be incorporated into the ethylenically unsaturated macromer and the resulting branch segment of the branched polymer, or the backbone of the branched polymer or both the branched segment and the backbone. The protected acidic group can be incorporated either during or after the formation of the branched polymer.

The branched polymer when present in the photosensitive compositions of this invention, typically will contain between about 3% to about 40% by weight of monomer units containing protected acidic groups, preferably between about 5% to about 50%, and more preferably between about 5% to about 20%. The branch segments of such a preferred branched polymer typically contain between 35% to 100% of the protected acidic groups present. Such a branched polymer when completely unprotected (all protected acidic groups converted to free acidic groups) has an acid number between about 20 and about 500, preferably between about 30 and about 330, and more preferably between about 30 and about 130, and analogously the ethylenically unsaturated macromer component preferably has an acid number of about 20 and about 650, more preferably between about 90 and about 300 and the majority of the free acidic groups are in the branch segments.

In a specific embodiment, the branched polymer comprises one or more branch segments chemically linked along a linear backbone segment wherein the branched polymers have a number average molecular weight ($M_n$) of about 500 to about 40,000. The branched polymer contains at least about 0.5% by weight of branch segments. The branch segments, also known as polymer arms, typically are randomly distributed along the linear backbone segment. The "polymer arm" or branch segment is a polymer or oligomer of at least two repeating monomer units, which is attached to the linear backbone segment by a covalent bond. The branch segment, or polymer arm, can be incorporated into the branched polymer as a macromer component, during the addition polymerization process of a macromer and a comonomer. A "macromer" for the purpose of this invention, is a polymer, copolymer or oligomer of molecular weight ranging from several hundred to about 40,000 containing a terminal ethylenically unsaturated polymerizable group. Preferably the macromer is a linear polymer or copolymer end capped with an ethylenic group. Typically, the branched polymer is a copolymer bearing one or more polymer arms, and preferably at least two polymer arms, and is characterized in that between about 0.5 and about 80 weight %, preferably between about 5 and about 50 weight % of the monomeric components used in the polymerization process is a macromer. Typically, comonomer components used along with the macromer in the polymerization process likewise contain a single ethylenic group that can polymerize with the ethylenically unsaturated macromer.

The ethylenically unsaturated macromer and the resulting branch segment of the branched polymer, and/or the backbone of the branched polymer, can have bonded thereto one or more protected acidic groups.

Polymerization Process

The polymers of this invention can be synthesized by any known polymerization process.

A typical polymerization process is solution polymerization. Any of the commonly used organic solvents known to those skilled in the art can be used as the solvent for polymerization. The solvent used for the polymerization depends upon the composition of the polymer. However, we have found 2-butanone and tetrahydrofuran to be useful solvents.

The temperature for the polymerization usually can be in the range of about 45 to about 150° C., and typically about 50 to about 85° C. if the polymerization is carried out at atmospheric pressure and reflux conditions. If the polymerization is carried out under pressure, the polymerization temperature usually can be in the range of about 0 to about 200° C., and typically can be in the range of about 50 to about 150° C. Alternatively the above polymers can be synthesized by (a) emulsion or (b) suspension (bead) polymerization procedures. A polymerization initiator can be employed such as 2,4-dimethyl-2,2'-azobis(pentanenitrile) or 2,2'azobis (2-methylbutyronitrile) or 2,2'-azobisisobutyronitrile. Such initiators are available commercially from Aldrich Chemical Co., Milwaukee, Wis.

To make the branched polymer described above, addition polymerization using a macromer and at least one ethylenically unsaturated monomer is preferred but any known method of preparing a branched polymers using either addition or condensation reactions can be used. Furthermore, use of either preformed backbones or branch segments or both can be used in this invention.

The branch segments attached to the linear backbone segment can be derived from macromers having ethylenic unsaturation at the terminal position which are prepared by methods well known in the art, such as provided in the general descriptions in U.S. Pat. No. 4,680,352 and U.S. Pat. No. 4,694,054.

The branched polymer may be prepared by any conventional addition polymerization process. The branched polymer, or comb polymer, may be prepared from one or more compatible ethylenically unsaturated macromer components and one or more compatible, conventional ethylenically unsaturated macromer components and one or more compatible, conventional ethylenically unsaturated monomer component(s). Preferred addition polymerizable, ethylenically unsaturated monomer components are acrylonitrile, methacrylonitrile, fumaronitrile, maleonitrile, protected or unprotected unsaturated fluoroalcohols, or protected or unprotected unsaturated carboxylic acids.

Photoactive Component (PAC)

The compositions of this invention contain at least one photoactive component (PAC) that usually is a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

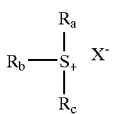

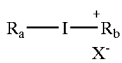

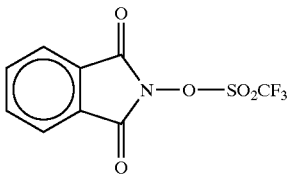

In structures I–II, $R_a$, $R_b$ and $R_c$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion X— in structures I-II can be, but is not limited to, $SbF_6^-$ (hexafluoroantimonate), $CF_3SO_3^-$-(trifluoromethylsulfonate triflate), and $C_4F_9SO_3^-$-(perfluorobutylsulfonate).

Dissolution Inhibitors and Additives

Various dissolution inhibitors can be utilized in this invention. Ideally, dissolution inhibitors (DIs) for deep and vacuum UV resists (e.g., 157 nm or 193 nm resists) should satisfy multiple needs including dissolution inhibition, plasma etch resistance, and adhesion behavior of resist compositions. Some dissolution inhibiting compounds also serve as plasticizers in resist compositions. Typically, a dissolution inhibitor is included in a photoresist composition to assist in the development process. A good dissolution inhibitor will inhibit the unexposed areas of the layer comprising the photoresist composition from dissolving during the development step in a positive working system. A useful dissolution inhibitor may also function as a plasticizer which function provides a less brittle layer comprising the photoresist composition that will resist cracking. Thus, a dissolution inhibitor can be added to improve contrast, plasma etch resistance, and adhesion behavior of photoresist composition compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", J. Electrochem. Soc. 1983, 130, 1433–1437.) Bile-salt esters are particularly attractive choices as DIs for several reasons, including their availability from natural sources, their possessing a high alicyclic carbon content, and particularly for their being transparent in the deep and vacuum UV regions of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VIII), and t-butyl-3-α-acetyl lithocholate (IX). Bile-acid esters, including compounds VII–IX, are preferred dissolution inhibitors in this invention.

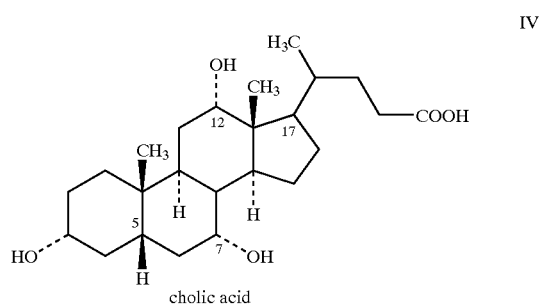

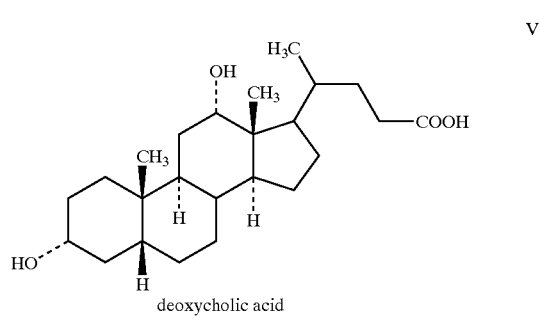

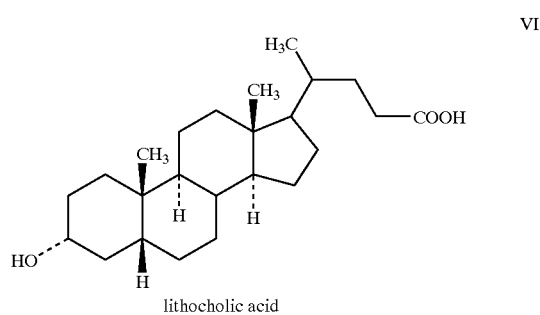

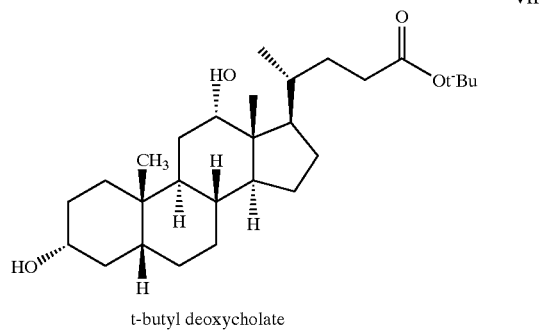

-continued

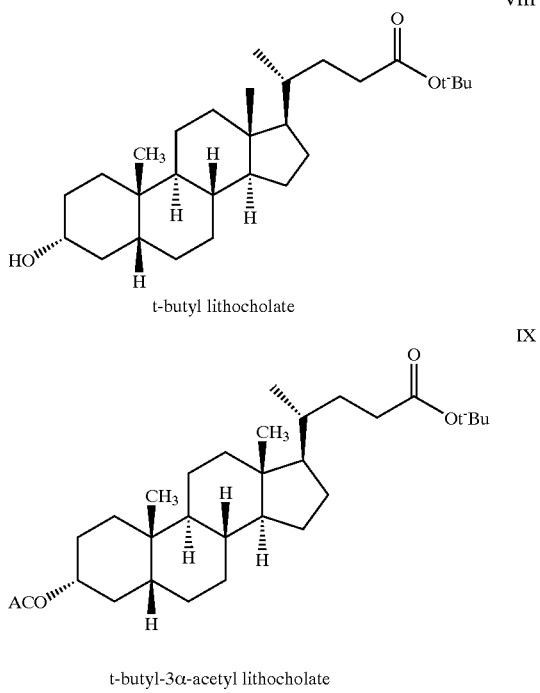

t-butyl lithocholate t-butyl-3α-acetyl lithocholate

Components for Negative-Working Photoresist Composition Embodiment

Some embodiments of this invention are negative-working photoresist compositions. These negative-working photoresist compositions comprise at least one binder polymer comprised of acid-labile groups and at least one photoactive component that affords photogenerated acid. Imagewise exposure of the resist generates acid which converts the acid-labile groups to polar groups (e.g., conversion of ester group (less polar) to acidic group (more polar)). Development with an organic solvent or critical fluid (having moderate to low polarity) produces a negative-working system in which exposed areas remain and unexposed areas are removed.

A variety of different crosslinking agents can be employed as required, or as optional, photoactive component(s) in the negative-working compositions of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate or low polarity).

Other Components

The compositions of this invention can contain optional additional components. Examples of additional components which can be added include, but are not limited to, resolution enhancers, adhesion promoters, residue reducers, coating aids, surfactants, plasticizers, and $T_g$ (glass transition temperature) modifiers.

Process Steps

Imagewise Exposure

The photoresist composition of this invention is sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, more preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Suitable laser devices for imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Photolithography using 193 nm exposure wavelength obtained from an argon fluorine (ArF) excimer laser is a leading candidate for future microelectronics fabrication using 0.18 and 0.13 micron design rules. Photolithography using 157 nm exposure wavelength obtained from a fluorine excimer laser is a leading candidate for microelectronic fabrication using 0.10 and 0.07 micron design rules.

Development

The polymers in the resist compositions of this invention contain sufficient acidic groups for development following imagewise exposure to UV light. With an acidic group or a protected acidic group aqueous development is possible using a basic developer such as sodium hydroxide solution, potassium hydroxide solution, or tetramethylammonium hydroxide solution.

When an aqueous processable photoresist composition is formed on the substrate, typically by coating or other suitable method, and imagewise exposed to UV light, the polymer of the photoresist composition has sufficient protected or unprotected acidic groups so that when exposed to UV light the exposed areas of the layer comprising the photoresist composition will become developable in basic solution.

With a positive-working layer comprising the photoresist composition, the photoresist composition will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds) or 1% sodium carbonate by weight (with development at a temperature of 30° C. usually for less than 2 or equal to 2 minutes).

With a negative-working layer comprising the photoresist composition, the photoresist composition will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmospheres below the critical pressure of the fluid. Carbon dioxide may be used for the critical fluid in the present invention. Various organic solvents can also be used as developer in this invention. These include, but are not limited to, halogenated solvents and non-halogenated sol vents. Halogenated solvents are preferred and fluorinated solvents are more preferred.

| GLOSSARY | |
|---|---|
| Analytical/Measurements | |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| s | singlet |
| m | multiplet |
| mL | milliliter(s) |
| mm | millimeter(s) |
| Tg | Glass Transition Temperature |
| $M_n$ | Number-average molecular weight of a given polymer determined by gel permeation chromatography using polystyrene standard |
| $M_w$ | Weight-average molecular weight of a given polymer determined by gel permeation chromatography using polystyrene standard |
| $D = M_w/M_n$ | Polydispersity of a given polymer |
| Absorbance | A = absorbance of a sample = $\log_{10}(1/T)$, where T = transmittance as defined below. |
| Optical absorbance per micron (Absorbance per micron) | A/μm = A/t, where A = optical absorbance and t = film thickness in microns. |
| Transmittance | Transmittance, T, = ratio of the radiant power transmitted by a sample to the radiant power incident on the sample and is measured for a specified wavelength λ (e.g., nm). |
| Chemicals/Monomers | |
| AN | Acrylonitrile |
| CFC-113 | 1,1,2-Trichlorotrifluoroethane (E. I. du Pont de Nemours and Company, Wilmington, DE) |
| DMF | N,N-Dimethylformamide |
| HFIBO | 1,1-Bis(trifluoromethyl)ethylene oxide |
| IBFA | 1,1,1-Trifluoro-4-methyl-2-(trifluoromethyl)-4-penten-2-ol |
| THF | Tetrahydrofuran Aldrich Chemical Co., Milwaukee, WI (solvent) |
| tBA | tertiary-Butyl acrylate |
| NB | Norbornene |
| Vazo ® 52 | 2,4-Dimethyl-2,2'-azobis(pentanenitrile) (E. I. du Pont de Nemours and Company, Wilmington, DE) |
| Vazo ® 67 | 2,2'-Azobis(2-methyl butyronitrile) (E. I. du Pont de Nemours and Company, Wilmington, DE) |
| PGMEA | Propylene glycol methyl ether acetate (solvent) Aldrich Chemical Co., Milwaukee, WI |
| VE-F-OH | $CH_2=CHOCH_2CH_2OCH_2C(CF_3)_2OH$ |
| VE-F-OMOM | $CH_2=CHOCH_2CH_2OCH_2C(CF_3)_2OCH_2OCH_3$ |
| Ultraviolet | |
| UV | Ultraviolet region of the electromagnetic spectrum which ranges from 10 nanometers to 390 nanometers |
| Extreme UV (EUV) | Region of the electromagnetic spectrum in the ultraviolet that ranges from 10 nanometers to 30 nanometers |
| Vacuum UV (VUV) | Region of the electromagnetic spectrum in the ultraviolet that ranges from 30 nanometers to 200 nanometers |
| Deep UV | Region of the electromagnetic spectrum in the ultraviolet that ranges from 200 nanometers to 300 nanometers |
| Near UV | Region of the electromagnetic spectrum in the ultraviolet that ranges from 300 nanometers to 390 nanometers |
| Polymers | |
| P(A/B/C) X/Y/Z | Polymer from copolymerization of A, B, and C containing X molar parts of repeat units derived from A, Y molar parts of repeat units derived from B, and Z molar parts of repeat units derived from C |

EXAMPLES

Unless otherwise specified, all temperatures are in degrees Centigrade, all mass measurements are in grams, and all percentages, with the exception of monomer percentages, are weight percentages. All parts and percentages of repeat units derived from monomers present in the polymers of this invention are expressed in molar parts and mole percentages, respectively, unless otherwise indicated. All molecular weight determinations were made by GPC using polystyrene standard. Comonomer percentages in the polymers utilized in the examples are accurate within 5–10 percent and were determined by C-13 NMR spectroscopy.

The term "clearing dose" as used herein indicates the minimum exposure energy density (e.g., in units of $mJ/cm^2$) to enable a given photoresist composition, following exposure, to undergo development.

Transparency Measurements

Two film samples of different thicknesses were made for a given polymer, their thicknesses determined, and their absorption coefficient values at 157 nm determined using the following general procedure:

Samples were first spin coated on silicon wafers on a Brewer Cee (Rolla, Mo.), Spincoater/Hotplate model 100CB.

a) Two to four silicon wafers were spun at different speeds (e.g. 2000, 3000, 4000, 6000 rpm), after small quantities (several mL) of the polymer solution was applied, to obtain films of differing thickness which were subsequently baled at 120° C. for 30 minutes to remove residual solvent. The thicknesses of the dried films were then measured using a Gaertner Scientific (Chicago, Ill.), L116A Ellipsometer. (400 to 1200 angstrom range).

b) Two $CaF_2$ substrates (1" (2.54 cm) diameter×0.80" (2.03 cm) thickness) were selected and each was measured to obtain reference data files. The measurements were made using a McPherson Spectrometer (Chemsford, Mass.), which included a 234/302 monochrometer, a 632 Deuterium Light Source, and a 658 photomultiplier detector whose output was measured using a Keithley 485 picoammeter.

c) Then two speeds were selected from the silicon wafer data (a) to spin the sample material onto the $CaF_2$ reference substrates (e.g. 2000 and 4000 rpm) to achieve the desired film thicknesses. Then each film and substrate was baled at 120° C. for 30 minutes after which the sample transmission data file of each was collected using the McPherson Spectrometer. Then the sample files were adjusted (i.e., divided) by the reference $CaF_2$ files to give transmittance files (i.e., sample film on $CaF_2$ divided by $CaF_2$ blank). The transmittance files were then converted to absorbance files using GRAMS386 and KALEIDAGRAPH software.

d) The resulting absorbance files from c) and film thickness values were then used to determine optical absorbance per micron of film thickness (Abs/micron) values as reported infra for certain examples. The optical absorbance per micron values of the two films for a given polymer were averaged to afford the average value reported for the given polymer.

Example 1

Preparation of 1,1-Bis(trifluoromethyl)ethylene Oxide (HFIBO)

Hexafluoroisobutene $CH_2=C(CF_3)_2$ (25 mL, 40 g) was condensed in a flask containing a solution of NaOCl (made at −5 to −3° C. by bubbling 15 g of chlorine into solution of 50 mL of 50 wt. % of NaOH in 100 mL of water) and 0.5 g of phase transfer catalyst—methyl tricaprylyl ammonium chloride—was added at −2 to +2° C. under vigorous stirring. Reaction mixture was kept at this temperature for 1–1.5 hours.

The resulting reaction mixture was transferred out of the reactor in vacuum, collected in a cold trap (at −78° C.) and distilled to give 37.5 g (yield 86%) of liquid, b.p. 42° C./760 mm Hg, which was identified as 1,1-bis(trifluoromethyl) ethylene oxide (1). The resulting compound (1) was established to have the indicated structure based upon the analytical data obtained as indicated below.

$^1$H NMR: 3.28(s)ppm $^{19}$F NMR: 73.34 (s) ppm $^{13}$C {H}NMR: 46.75 (s), 54.99 (sept, 37 Hz), 126.76 (q, 275)

IR (gas, major): 1404 (s), 1388 (s), 1220 (s), 1083 (s), 997 (m), 871 (m), 758 (w), 690 (m), 636 (w) cm−1

Anal. Calcd for $C_4H_2F_6O$: C, 26.68, H1.12. Found: C, 27.64, H, 1.10.

Example 2

Synthesis of $CH_2=CHOCH_2CH_2OCH_2C(CF_3)_2OH$ (VE-F-OH))

A dry 5-L round bottom flask equipped with mechanical stirrer, condenser and addition funnel was flushed with nitrogen and charged with 14.2 g (0.59 mol) of 95% sodium hydride and 400 mL of anhydrous DMF. This mixture was cooled to 10° C. and 41.6 g (0.47 mol) of 2-hydroxyethylvinyl ether was added dropwise over ½ hr. An additional 250 mL of DMF were added and the mixture was stirred for 1 hr. 1,1-Bis(trifluoromethyl)ethylene oxide from Example 1 (Hexafluoro-isobutylene epoxide, HFIBO) (85 g, 0.47 mol) was added over 1 hour at 20–23° C. The resulting suspension was stirred for 22 hours. It was then transferred to a one-neck flask and most of the DMF was removed on a rotary evaporator at 0.1 mm and 29° C. The residue was dissolved in 250 mL of water and 10% hydrochloric acid was carefully added until the solution pH was about 8. An oil supernatant which separated was collected, washed with water and dried over a mixture of anhydrous sodium sulfate and potassium carbonate. The resulting oil, was filtered and the filtrate was distilled in a Kugelrolu apparatus at 0.5 nm and 50–59° C. from a small amount of anhydrous potassium carbonate to give 89 g (71%) of oil which was stored over potassium carbonate. $^1$H NMR ($\delta C_6D_6$) 3.12 (d, 2H), 3.28 (d, 2H), 3.60 (s, 2H), 3.90 (d, 1H), 4.07 (d, 1H), 6.20 (dd, 1H). $^{19}$F NMR ($\delta C_6D_6$) −76.89 (s). Another sample prepared in the same fashion was submitted for elemental analysis. Calcd. for $C_8H_{10}F_6O_3$: C, 35.83; H, 3.76; F, 42.51. Found: C, 35.13; H, 3.92; F, 41.40.

Example 3

Synthesis of VE-F-OMOM

A round bottom flask with mechanical stirrer, thermocouple, addition funnel and nitrogen inlet was swept with nitrogen and charged with 300 mL of anhydrous THF and 13.1 g (0.52 mol) of 95% sodium hydride. 2-Hydroxyethylvinyl ether (45.4 g, 0.5 mol) was added dropwise so that the reaction temperature did not exceed 35° C. Additional THF was added to the resulting slurry as needed to facilitate stirring. After stirring for 1 hour at ambient temperature (about 20° to about 23° C.), the mixture was cooled to about 0° C. and HFIBO from Example 1 (93.9 g, 0.52 mol) was added dropwise. An exotherm to about 40° C. was observed and the reaction mixture became a homogeneous solution. It was stirred overnight at room temperature. The solution was cooled to 0° C. and chloromethylmethyl ether (41.8 g, 0.52 mol) was added dropwise resulting in an exotherm to 5° C. and formation of a precipitate. This precipitate containing mixture was stirred overnight at room temperature. The mixture was filtered and the solid was washed with 100 mL THF. The combined filtrate and washings were concentrated on the rotary evaporator to an oil which was distilled on a Kugelrohr at 0.13 torr and 30° C. The distillate was purified by flash chromatography using 9/1 hexane/ethyl acetate to elute. There was isolated 82.3 g (53%) of product as an oil. $^1$H NMR ($\delta CDCl_3$) 3.44 (s, 3H), 3.75 (m, 2H), 3.85 (m, 2H), 4.04 (dd, 1H), 4.17 (s, 2H), 4.20 (dd, 1H), 5.10 (s, 2H), 6.50 (dd, 1H). $^{19}$F NMR ($\delta CDCl_3$) −74.4. Another sample prepared in the same fashion was submitted for elemental analysis. Calcd. for $C_{10}H_{14}F_6O_4$: C, 38.47; H, 4.52; F, 36.51. Found: C, 38.47; H, 4.69; F, 33.92.

Example 4A

P(AN/VE-F-OH)

Polymer Synthesis

An acrylonitrile/vinyloxyethyloxyhexafluoroalcohol adduct copolymer was prepared by the following procedure. In the procedure a 100 mL flask equipped with a thermocouple, stirrer, dropping funnels, reflux condenser, Dean-Stark trap and a means for bubbling nitrogen through the reaction was used.

Components and amounts used in this Example are listed in the following Table.

| Components | Grams |
|---|---|
| Portion 1 | |
| Vinyloxyethyloxyhexafluoroalcohol adduct(VE-F-OH) | 1.34 |
| Acrylonitrile (AN) | 0.84 |
| 2,2'-Azobis (2-Methyl Butyronitrile): Vazo ®-67 | 0.10 |
| Acetonitrile | 2.15 |
| Portion 2 | |
| Vinyloxyethyloxyhexafluoroalcohol adduct(VE-F-OH) | 12.06 |
| Acetonitrile | 7.16 |

| Components | Grams |
|---|---|
| Portion 3 | |
| Acrylonitrile (AN) | 7.16 |
| 2,2'-Azobis (2,4-Dimethyl Valeronitrile): Vazo ®-52 | 0.40 |
| Acetonitrile | 12.09 |
| Portion 4 | |
| 2,2'-Azobis (2-Methyl Butyronitrile): Vazo ®-67 | 0.10 |
| Acetonitrile | 1.96 |
| Total | 45.36 |

Vazo®-67 initiator was dissolved with 1.65 grams of acetonitrile (part of portion 1) in a container. All the remaining ingredients of portion 1 were added into the 100 mL reaction flask and raised to its reflux temperature. Then the initiator solution was added as one shot into the 100 mL flask. The initiator container was rinsed with the remaining 0.5 gram of acetonitrile and added into the reaction flask. Immediately following the Vazo®-67 initiator shot, portion 2 monomer thoroughly dissolved in acetonitrile and portion 3 Vazo®-52 thoroughly dissolved in acetonitrile and acrylonitrile were simultaneously fed over 240 minutes at reflux temperature. After the portion 2 and 3 feeds were completed, portion 4 Vazo®67 initiator thoroughly dissolved in acetonitrile was added as one shot. The polymerization was continued for another 90 minutes at reflux temperature. The solvent was then stripped to remove the unreacted acrylonitrile and the stripped solvent and monomer were collected into a flask containing ethylenedianine. Then 20 mL of acetonitrile was added and stripped again to remove the traces of acrylonitrile left in the polymer. The stripping procedure was repeated two more times by adding 20 mL of acetonitrile each time in the reaction flask. Finally, the polymer was precipitated by adding the polymer solution in acetonitrile into large excess (250 grams) of petroleum ether. The precipitated polymer was filtered and washed twice with petroleum ether. The wet polymer was dried in a vacuum oven for 12 hours at ambient temperature. In this example 4A, the molar composition of the monomers in the feed was 75 molar parts of AN and 25 molar parts of VE-F-OH. The levels of repeat units in the polymer of this Example (Polymer 4A) as determined by C-1 3 NMR in this example were 73.1 parts derived from AN and 26.9 parts derived from VE-F-OH. The yield obtained was 15.3 grams (72%). The resulting polymer has a number average molecular weight of 8392 ($M_n$) and a polydispersity (D) of 1.88.

Three other P(AN/VE-F-OH) polymers (Polymers 4B, 4C, 4D) with varying mole ratios were synthesized using the above procedure except for the following variations:

Example 4B

Polymer 4B: The procedure of Example 4A was followed but the monomer feed used was 90 molar parts of AN and 10 molar parts of VE-F-OH.

Example 4C

Polymer 4C: The procedure of Example 4A was followed but the monomer feed used was 82.5 molar parts of AN and 17.5 molar parts of VE-F-OH.

Example 4D

Polymer 4D: The procedure of Example 4A was followed but the monomer feed used was 84 molar parts of AN and 16 molar parts of VE-F-OH.

The polymer identification (ID), molar composition, polymer yield, number average molecular weight ($M_n$) and polydispersity (D) and optical absorbance per micron (Abs/μm) (as determined in the following section) measured at 157 nm are given below for all four polymers.

| Polymer ID | Molar composition* of P(AN/VE-F-OH)(m/m) | yield (%) | $M_n$ | D | Abs/μm** |
|---|---|---|---|---|---|
| 4A | 73.1/26.9 | 72 | 8392 | 1.88 | 2.9 |
| 4B | 90.0/10.0 | 76 | 3807 | 1.43 | 2.8 |
| 4C | 84.6/15.4 | 57 | 7127 | 1.81 | 3.0 |
| 4D | 84.7/15.3 | 66 | — | — | 2.6 |

*Determined by C-13 NMR spectroscopy.
**Average of two values for two different film samples of a given polymer.

Optical Absorbance per Micron Determination

A solution of Polymer 4D [P(AN/VE-F-OH) (84.7/15.3)] in 2-heptanone containing 5 weight % solids was spin coated at a spin speed of 3000 rpm onto $CaF_2$ substrates to produce polymer film of 678 angstroms thickness and then at a spin speed of 5000 rpm onto $CaF_2$ substrates to produce polymer film of 534 angstroms thickness. VUV absorbance measurements using the McPherson Spectrometer were then used to determine the optical absorbance per micron as explained above. A similar coating process was followed for Polymers 4A, 4B and 4C, with the following exceptions:

Polymer 4A: spin speed of 5000 rpm to produce a film of 674 angstroms and spin speed of 6000 rpm to produce a film of 614 angstroms film; coating solvent was PGMEA and coating solution contained 5 weight % solids.

Polymer 4B: spin speed of 2500 rpm to produce a film of 660 angstroms and 3500 rpm to produce a film of 562 angstroms; coating solvent was cyclohexanone and coating solution contained 3 weight % solids.

Polymer 4C: spin speed of 1500 rpm to produce a film of 608 angstroms and 2500 to produce a film of 476 angstroms; coating solvent was PGMEA and coating solution contained 3 weight % solids.

The optical absorbance per micron in units of inverse microns for a film formed from Polymer 4D (AN/VE-F-OH) (84.7/15.3) at 157 nm is as follows: 2.61/micron for the film having 678 angstroms thickness; 2.64 for the film having 534 angstroms thickness, average is equal to 2.62/micron.

In a similar manner, the average optical absorbance per micron values in units of inverse microns for Polymers 4A, 4B, and 4C at 157 nm were determined as follows

| Polymer | Thickness (Å) | Abs/μm |
|---|---|---|
| 4A | 674 | 3.00 |
|  | 614 | 2.86 |
| 4B | 660 | 2.82 |
|  | 562 | 2.69 |
| 4C | 608 | 3.00 |
|  | 476 | 2.91 |

Image Generation/Lithographic Evaluation

The following solution was prepared and magnetically stirred overnight.

| Component | Wt. (gm) |
|---|---|
| AN/VE-F-OH copolymer (84.7/15.3) as described in Example 4D). | 0.464 |
| 2-Heptanone | 5.184 |
| t-Butyl Lithocholate | 0.120 |
| 6.82% (wt) solution of triphenylsulfonium nonaflate dissolved in 2-heptanone which had been filtered through a 0.45μ PTFE syringe filter. | 0.235 |

Spin coating was done using a Brewer Science Inc. Model-100CB combination spin coater/hotplate on a4 in. (10.2 cm) diameter Type "P", <100> orientation, silicon wafer. Development was performed on a Litho Tech Japan Co. Resist Development Analyzer (Model-790). The wafer was prepared by depositing 6 mL of hexamethyldisilazane(HMDS) primer and spinning at 1000 rpm for 5 seconds and then at 3500 rpm for 10 seconds. Then 3 mL of the above solution, after filtering through a 0.45 μm PTFE syringe filter, was deposited and spun at 3000 rpm for 60 seconds and baked at 120° C. for 60 seconds. 248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 120 seconds, providing an unattenuated dose of about 80 mJ/cm2. By using a mask with 18 positions of varying neutral optical density, a wide variety of exposure doses were generated. After exposure the exposed wafer was balked at 120° C. for 120 seconds.

The wafer was developed in aqueous tetramethylammonium hydroxide (TMAH) solution (ONKA NMD-3, 2.38% TMAH solution) for two 15 second intervals. This test generated a positive image.

Example 5A

P(AN/VE-F-OH/VE-F-OMOM) (78.5/12.5/9.0)

(AN/VE-F-OH/VE-F-OMOM), an acrylonitrile/vinyloxyethyloxyhexafluoroalcohol adduct/protected vinyloxyethyloxyhexafluoroalcohol adduct polymer, was prepared by the following procedure. In this procedure, a 100 mL flask equipped with a thermocouple, stirrer, dropping funnels, reflux condenser, Dean-Stark trap and the means for bubbling nitrogen through the reaction was used. The components and amounts in this example are listed in the following Table.

| Components | Grams |
|---|---|
| Portion 1 | |
| Vinyloxyethyloxyhexafluoroalcohol adduct(VE-F-OH) | 0.805 |
| Acrylonitrile (AN) | 1.313 |
| Protected vinyloxyethyloxyhexafluoroalcohol adduct(VE-F-OMOM) | 0.702 |
| 2,2'-Azobis (2-Methyl Butyronitrile): Vazo ®-67 | 0.150 |
| Acetonitrile | 3.225 |
| Portion 2 | |
| Vinyloxyethyloxyhexafluoroalcohol adduct(VE-F-OH) | 7.235 |
| VE-F-OMOM | 6.319 |
| Acetonitrile | 4.337 |
| Portion 3 | |
| Acrylonitrile | 11.819 |
| 2,2'-Azobis (2,4-Dimethyl Valeronitrile): Vazo ®-52 | 0.60 |
| Acetonitrile | 9.47 |
| Portion 4 | |
| 2,2'-Azobis (2-Methyl Butyronitrile): Vazo ®-67 | 0.150 |
| Acetonitrile | 2.85 |
| Total | 48.97 |

Vazo®V-67 initiator was dissolved with 1.225 grams of acetonitrile (part of portion 1) in a container. All the remaining ingredients of portion 1 were added into the 100 mL reaction flask and raise to its reflux temperature. Then the initiator solution was added as one shot into the flask. The initiator container was rinsed with 0.5 gram of acetonitrile and added into the reaction flask. Immediately following the Vazo®-67 initiator shot, portion 2 monomer thoroughly dissolved in acetonitrile and portion 3 Vazo®-52 thoroughly dissolved in acetonitrile and acrylonitrile were simultaneously fed over 240 minutes at reflux temperature. After the portion 2 and 3 feeds were completed, portion 4 Vazo®67 initiator thoroughly dissolved in acetonitrile was added as one shot. The polymerization was continued for another 90 minutes at reflux temperature. The solvent was then stripped to remove the unreacted acrylonitrile and the stripped solvent and monomer were collected into a flask containing ethylenediamine. Then 18 mL of acetonitrile was added and stripped again to remove the traces of acrylonitrile left in the polymer. The stripping procedure was repeated four more times by adding, 18 mL of acetonitrile each time in the reaction flask. Finally, the polymer was precipitated by adding the polymer solution in acetonitrile into large excess (700 grams) of petroleum ether. The precipitated polymer was filtered and washed twice with petroleum ether. The wet polymer was dissolved in a solvent mixture having 30 mL of acetonitrile and 18 mL of acetone. The polymer solution was reprecipitated by adding into 700 grams of petroleum ether, filtered and dried in a vacuum oven for 12 hours at 50° C. In this Example 5A, the molar composition of the monomers in the feed was 82.5 molar parts of AN, 10 molar parts of VE-F-OH, and 7.5 molar parts of VE-F-OMOM. The levels of repeat units in the polymer as determined by C-13 NMR in this example were 78.5 molar parts derived from AN, 12.5 molar parts derived from VE-F-OH, and 9.0 molar parts derived from VE-F-OMOM. The yield of P(AN/VE-F-OH/VE-F-OMOM) (78.5/12.5/9.0), Polymer 5A, was 66%.

Example 5B

Another P(AN/VE-F-OH/VE-F-OMOM), Polymer 5B, was synthesized using the same procedure reported above but varying the monomer amounts such that the monomer feed was 86 molar parts of AN, 12 molar parts of VE-F-OH, and 2 molar parts of VE-F-OMOM. The yield of P(AN/VE-F-OH/VE-F-OMOM), Polymer 5B, was 69%.

Optical Absorbance per Micron Determination

A solution of Polymer 5B [P(AN/VE-F-OH/VE-F-OMOM) (78.5/12.5/9.0)] in cyclohexanone/2-heptanone (1:1 by weight) containing 2.5 weight % solids was spin coated at a spin speed of 2000 rpm onto CaF$_2$ substrates to produce polymer film of 450 angstroms thickness and then was spin coated at a spin speed of 2500 rpm onto CaF$_2$ substrates to produce polymer film of 388 angstroms thickness. VUV absorbance measurements using the McPherson Spectrometer were then used to determine the optical absorbance per micron as explained supra.

The optical absorbance per micron in units of inverse microns for Polymer 5B at 157 nm determined using these polymer films was as follows: 2.71/micron for the 450 angstroms thick film, 2.84/micron for the 388 angstroms thick film; average of these two values being 2.77/micron.

Example 6

P(AN/VE-F-OH/tBA) (87.6/8.4/4.0)

Polymer Synthesis

P(AN/VE-F-OH/tBA), an acrylonitrile/vinyloxyethyloxyhexafluoroalcohol adduct/tertiary-butyl acrylate terpolymer, was prepared in the following procedure. In this procedure a 100 mL flask equipped with a thermocouple, stirrer, dropping funnels, reflux condenser, Dean-Stark trap and the means for bubbling nitrogen through the reaction was used. The components and amounts used in this example are listed in the following table.

| Component | Grams |
| --- | --- |
| Portion 1 | |
| Vinyloxyethyloxyhexafluoroalcohol adduct(VE-F-OH) | 0.804 |
| Acrylonitrile (AN) | 1.313 |
| Tertiary butyl acrylate | 0.288 |
| 2,2'-Azobis (2-Methyl Butyronitrile): Vazo ®-67 | 0.150 |
| Acetonitrile | 3.225 |
| Portion 2 | |
| Vinyloxyethyloxyhexafluoroalcohol adduct(VE-F-OH) | 7.235 |
| Tertiary butyl acrylate | 2.596 |
| Acetonitrile | 4.337 |
| Portion 3 | |
| Acrylonitrile | 11.819 |
| 2,2'-Azobis (2,4-Dimethyl Valeronitrile): Vazo ®-52 | 0.60 |
| Acetonitrile | 9.47 |
| Portion 4 | |
| 2,2'-Azobis (2-Methyl Butyronitrile): Vazo ®-67 | 0.150 |
| Acetonitrile | 2.85 |
| Total | 44.84 |

Vazo®-67 initiator was dissolved with 1.225 grams of acetonitrile (part of portion 1) in a container. All the remaining ingredients of portion 1 were added into the 100 mL reaction flask and raised to its reflux temperature. Then the initiator solution was added as one shot into the flask. The initiator container was rinsed with 0.5 gram of acetonitrile and added into the reaction flask. Immediately following the Vazo®-67 initiator shot, portion 2 monomer thoroughly dissolved in acetonitrile and portion 3 Vazo®-52 thoroughly dissolved in acetonitrile and acrylonitrile were simultaneously fed over 240 minutes at reflux temperature. After the portion 2 and 3 feeds were completed, portion 4 Vazo®67 initiator thoroughly dissolved in acetonitrile was added as one shot. The polymerization was continued for another 90 minutes at reflux temperature. The solvent was then stripped to remove the unreacted acrylonitrile and the stripped solvent and monomer were collected into a flask containing ethylenediamine. Then 18 mL of acetonitrile was added and stripped again to remove the traces of acrylonitrile left in the polymer. The stripping procedure was repeated four more times by adding 18 mL of acetonitrile each time in the reaction flask. Finally, the polymer was precipitated by adding the polymer solution in acetonitrile into large excess (700 grams) of petroleum ether. The precipitated oily polymer was filtered and washed twice with petroleum ether. The oily polymer was dissolved in a solvent mixture having 50 mL of acetonitrile and 18 mL of acetone. The polymer solution was reprecipitated by adding into 700 grams of petroleum ether, filtered and dried in a vacuum oven for 12 hours at 56° C. In this Example 6, the molar composition of the monomers in the feed was 82.5 molar parts of AN, 10 molar parts of VE-F-OH, and 7.5 molar parts of VE-F-OMOM. The levels of repeat units in the polymer as determined by C-13 NMR in this example were 87.6 molar parts derived from AN, 8.4 molar parts derived from VE-F-OH, and 4.0 molar parts derived from VE-F-OMOM. The yield of Polymer 6 (AN/VE-F-OH/tBA) (87.6/8.4/4.0) was 74%.

Optical Absorbance per Micron Determination

A solution of this Polymer 6 in a 2/1 weight mixture of cyclohexanone and 2-heptanone was spin coated at a spin speed of 3000 rpm onto CaF$_2$ substrates to produce a polymer film of 438 angstroms (3.29 Å/mm) thickness and at a spin speed of 3500 rpm to produce a polymer film of 399 angstroms (3.38 Å/mm) thickness. VUV absorbance measurements using the McPherson Spectrometer were then used to determine the optical absorbance per micron as explained above.

The optical absorbance per micron in units of inverse microns for P(AN/VE-F-OH/tBA) (87.6/8.4/4.0) at 157 nm determined using this polymer film is 3.29/micron for the film of 438 angstroms thickness and 3.38/micron for the film of 399 angstroms thickness. The average of these two determinations is 3.34/micron.

What is claimed is:

1. A photoresist composition comprising:
   (a) a polymer comprising:
      (i) a first repeat unit derived from at least one ethylenically unsaturated compound comprising a vinyl ether and having the structure:

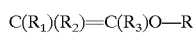

where $R_1$, $R_2$, and $R_3$ independently area hydrogen atom or an alkyl group ranging from 1 to 3 carbon atoms;
      R is a substituted or unsubstituted hydrocarbon group containing from 1 to 20 carbon atoms, when R is a substituted hydrocarbon group it contains at least one fluorine, chlorine, bromine or oxygen atom;
      (ii) a second repeat unit derived from at least one ethylenically unsaturated compound having the structure:

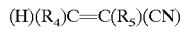

wherein $R_4$ is a hydrogen atom or a cyano group; $R_5$ is a hydrogen atom, an alkyl group ranging from 1 to 8 carbon atoms, or a $CO_2R_6$ group, wherein $R_6$ is a hydrogen atom or an alkyl group ranging from 1 to 8 carbon atoms; and
      (iii) an acidic group, wherein the acidic group is a fluoroalcohol, comprising the structure:

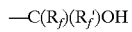

wherein $R_f$ and $R_f'$ are the same or different fluoroalkyl groups containing from 1 to 10 carbon atoms or taken together are $(CF_2)_n$ wherein n is an integer ranging from 2 to 10, wherein the fluoroalcohol is optionally protected, and at least one photoactive component.

2. The photoresist composition of claim 1 in which the first repeat unit is derived from 2-hydroxyethylvinyl ether; methylvinylether; ethylvinylether; propylvinylether; 2-ethyihexylvinylether; isopropylvinylether; $CH_2=CO(CH_2)_2(CF_3)_mCF_3$, wherein m ranges from 0–12; phenylvinylether; benzylvinylether; p-tolylvinyl ether; or 1-adamantylvinyl ether.

3. The photoresist composition of claim 2 in which the second repeat unit is derived from acrylonitrile, methacrylonitrile, fumaronitrile, or maleonitrile.

4. The photoresist composition of claim 1 in which the first repeat unit comprises the protected acidic group, the first repeat unit being (a) a reaction product of 1,1-bis(trifluoromethyl)ethylene oxide and (i) 2-hydroxyethylvinyl ether or (ii) 4-hydroxybutylvinyl ether, which reaction product is subsequently reacted with either (i) chloromethylmethyl ether or (ii) t-butyloxycarbonyl or (b) a t-alkyl substituted acrylate or t-alkyl substituted methacrylate in which the alkyl group contains from 1 to about 10 carbon atoms.

5. The photoresist composition of claim 3 wherein the first repeat unit or the second repeat unit or both comprise the acidic group or the protected acidic group.

6. The photoresist composition of claim 1 wherein the first repeat unit comprises the acidic group which acidic group is a fluoroalcohol having the structure:

wherein A is an unsubstituted or substituted alkylene group containing from 1 to 12 carbon atoms which is a branched chain or a linear chain; a substituted or unsubstituted alicyclic group containing from 3 to 10 carbon atoms, when A is a substituted alkylene group or alicyclic group, A contains a heteroatom selected from the group consisting of oxygen, sulfur, fluorine and nitrogen; $R_f$ and $R_f'$ are the same or different fluoroalkyl groups containing from 1 to 10 carbon atoms or taken together are $(CF_2)_n$ wherein n an integer ranging from 2 to 10.

7. The photoresist composition of claim 1 wherein the fluoroalcohol is protected.

* * * * *